United States Patent
LaBrake et al.

(10) Patent No.: US 10,079,152 B1
(45) Date of Patent: Sep. 18, 2018

(54) METHOD FOR FORMING PLANARIZED ETCH MASK STRUCTURES OVER EXISTING TOPOGRAPHY

(71) Applicant: CANON KABUSHIKI KAISHA, Tokyo (JP)

(72) Inventors: Dwayne L. LaBrake, Cedar Park, TX (US); Douglas J. Resnick, Leander, TX (US)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 15/441,381

(22) Filed: Feb. 24, 2017

(51) Int. Cl.
*H01L 21/308* (2006.01)
*H01L 21/311* (2006.01)
*H01L 21/02* (2006.01)
*H01L 21/3105* (2006.01)
*H01L 21/027* (2006.01)

(52) U.S. Cl.
CPC ...... *H01L 21/3081* (2013.01); *H01L 21/0273* (2013.01); *H01L 21/02115* (2013.01); *H01L 21/02282* (2013.01); *H01L 21/3086* (2013.01); *H01L 21/3088* (2013.01); *H01L 21/31051* (2013.01); *H01L 21/31111* (2013.01)

(58) Field of Classification Search
CPC ........... H01L 21/3081; H01L 21/31051; H01L 21/3086
See application file for complete search history.

(56) References Cited

U.S. PATENT DOCUMENTS

| | | |
|---|---|---|
| 6,873,087 B1 | 3/2005 | Choi et al. |
| 6,932,934 B2 | 8/2005 | Choi et al. |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 7,998,651 B2 | 8/2011 | Wuister et al. |
| 8,071,275 B2 | 12/2011 | Bernard et al. |
| 8,076,386 B2 | 12/2011 | Xu et al. |
| 8,394,282 B2 | 3/2013 | Panga et al. |
| 9,415,418 B2 | 8/2016 | Sreenivasan et al. |
| 2005/0056963 A1 | 3/2005 | McCutcheon |

(Continued)

*Primary Examiner* — Jay C Chang
*Assistant Examiner* — Mikka Liu
(74) *Attorney, Agent, or Firm* — Cameron A. King; Daniel Ratoff

(57) ABSTRACT

A method used to create small pattern features over existing topography variations. The method includes providing a substrate having a surface having non-planar surface variations; forming a multi-stack layer over the substrate, by applying a first carbon layer over the substrate, with the resultant first carbon layer having non-planar surface variations corresponding to the non-planar surface variations of the underlying substrate, followed by applying a second planarizing layer over the first carbon layer; depositing a hard mask on the multi-stack layer; forming a patterned layer on the hard mask, the formed patterned layers having features; and performing one or more etch steps to etch the formed patterned layer features into the multi-layer stack. The multi-layer stack has a composite effective mechanical stiffness ($E_{eff}$) sufficient to maintain the one or more etched features with minimal feature collapse.

13 Claims, 9 Drawing Sheets

(56) References Cited

U.S. PATENT DOCUMENTS

| | | | |
|---|---|---|---|
| 2005/0184637 A1* | 8/2005 | Sugawara | H01J 29/862 |
| | | | 313/477 R |
| 2013/0068720 A1* | 3/2013 | Taniguchi | H01L 21/32139 |
| | | | 216/13 |
| 2014/0227887 A1* | 8/2014 | Kim | C08G 61/02 |
| | | | 438/781 |
| 2015/0048050 A1 | 2/2015 | Sreenivasan et al. | |
| 2017/0003568 A1* | 1/2017 | Nishi | G02F 1/13454 |

* cited by examiner

METHOD FOR FORMING PLANARIZED ETCH MASK STRUCTURES OVER EXISTING TOPOGRAPHY

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

Exemplary nano-fabrication techniques in current use for patterning the features that form these structures include optical lithography, photolithography, nanoimprint lithography, extreme ultraviolet lithography and electron beam lithography, and the like. However, as feature sizes shrink to dimensions less than 100 nanometers, it becomes more difficult to maintain the aspect ratios necessary for high fidelity pattern transfer, particularly when other factors such as topography variations on the existing substrate surface are introduced.

SUMMARY

In an aspect, a method can be used to create small pattern features over existing topography variations. The method includes providing a substrate having a surface having non-planar surface variations; forming a multi-stack layer over the substrate, by applying a first underlying layer over the substrate, with the resultant first underlying layer having non-planar surface variations corresponding to the non-planar surface variations of the underlying substrate, followed by applying a second planarizing layer over the first underlying layer; depositing a hard mask on the multi-stack layer; and forming a patterned layer on the hard mask, the formed patterned layers having features, wherein the multi-layer stack has a composite effective mechanical stiffness ($E_{eff}$) sufficient to maintain the one or more etched features having a feature dimension of 50 nm or less and an aspect ratio of 2.5:1 or more with minimal feature collapse. In a further aspect, one or more etch steps are performed to etch the formed patterned layer features into the multi-layer stack.

In an embodiment, the first underlying layer comprises a carbon layer. In another embodiment, the first underlying layer comprises a spin-on carbon (SOC) layer.

In another embodiment, the second planarizing layer comprises an organic material.

In a particular embodiment, the one or more etched features have aspect ratios of 5:1 or more.

In a further embodiment, feature collapse of the one or more etched features in the multi-layer stack is reduced as compared to the same features etched under the same conditions into a layer formed entirely of the second planarizing material.

In yet another embodiment, the etch resistance of the second planarizing material is within 30% of the etch resistance of the first underlying layer.

In a further embodiment, the patterned features have specified critical dimensions (CDs), and wherein the etched features in the multi-layer stack maintain higher critical dimension (CD) uniformity as compared to the same features etched into a layer formed entirely of the first underlying layer material.

In another embodiment the second planarizing layer is applied by an imprint lithography technique.

In yet another embodiment, the patterned layer is formed by an imprint lithography technique.

In a further embodiment, the patterned layer is formed by an optical or EUV imaging technique.

In another embodiment, one or more additional etch steps are performed to transfer the formed patterned layer features into the substrate.

In yet another particular embodiment, the multi-layer stack has a composite effective mechanical stiffness ($E_{eff}$) sufficient to maintain the one or more etched features without feature collapse while performing the one or more etch steps.

In another aspect, a multi-stack layer is provided that can include: a substrate having a surface having non-planar variations; a first carbon layer formed over the substrate surface and having non-planar surface variations corresponding to the non-planar surface variations of the substrate surface, and a second planarizing layer formed over the first carbon layer and having a planar surface, and wherein the multi-layer stack has a composite effective mechanical stiffness ($E_{eff}$) sufficient to maintain 50 nm or smaller features at aspect ratios of 2.5:1 or more with minimal feature collapse.

In an embodiment, the first carbon layer comprises a spin-on carbon (SOC) layer.

In another embodiment, the second planarizing layer comprises an organic material.

In a particular embodiment, the multi-layer stack has a composite effective mechanical stiffness ($E_{eff}$) sufficient to maintain 50 nm or smaller features at aspect ratios of 5:1 or more with minimal feature collapse.

In a further embodiment, the etch resistance of the second planarizing material is within 30% of the etch resistance of the first carbon layer.

In yet another embodiment, the substrate further comprises a semiconductor wafer.

In a further aspect, a method of manufacturing a device is provided that includes transferring features of a formed patterned layer into a substrate according to the methods provided herein and then processing the substrate to manufacture the device.

In one embodiment, the substrate further comprises a semiconductor wafer and the manufactured device is a semiconductor device.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
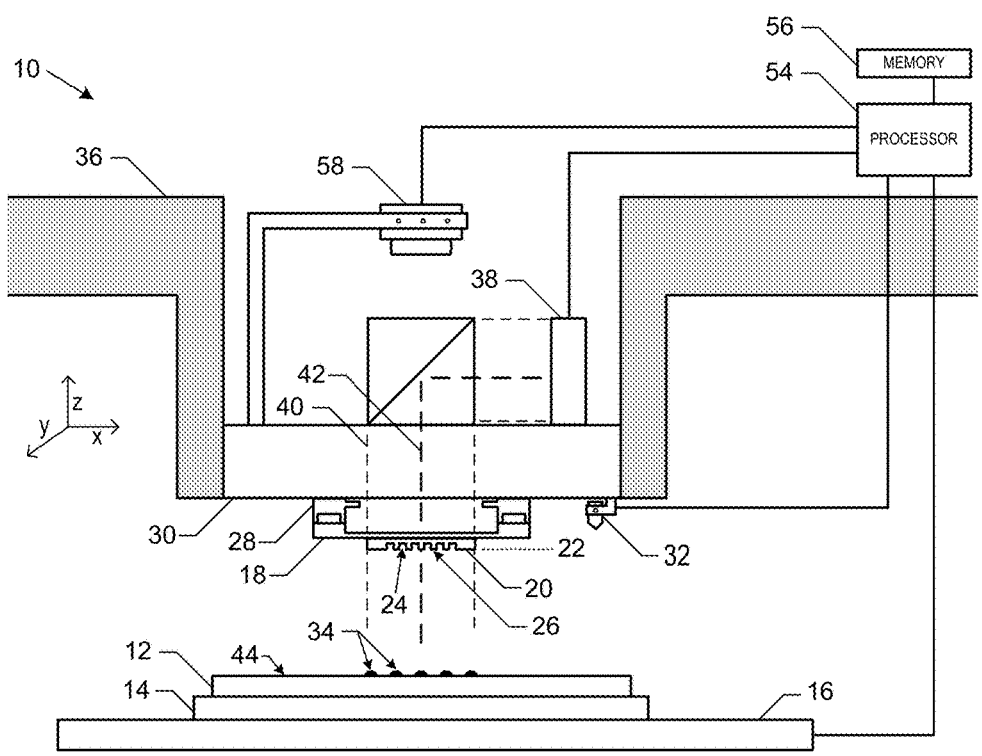
FIG. 1 illustrates a simplified side view of a nanoimprint lithography system having a template and a mold spaced apart from a substrate.

As previously noted, patterned features can be formed by a number of different lithographic techniques including photolithography, nanoimprint lithography, extreme ultraviolet lithography and electron beam lithography, and the like. The pattern features are used as an etch mask to define a pattern transferred into an underlying material, film or substrate. An exemplary nanoimprint lithography system is illustrated in FIG. 1. Nanoimprint lithography system 10 can be used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12. Template 18 may be coupled to chuck 28. Chuck 28 may be configured as, but not limited to, vacuum, pin-type, groove-type, electrostatic, electromagnetic, and/or other similar chuck types. Further, chuck 28 may be coupled to imprint head 30 which in turn may be moveably coupled to bridge 36 such that chuck 28, imprint head 30 and template 18 are moveable in at least the z-axis direction.

Nanoimprint lithography system 10 may further comprise a fluid dispense system 32. Fluid dispense system 32 may be used to deposit formable material 34 (e.g., a polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. No. 7,157,036 and U.S. Pat. No. 8,076,386, both of which are herein incorporated by reference.

Figure 2:
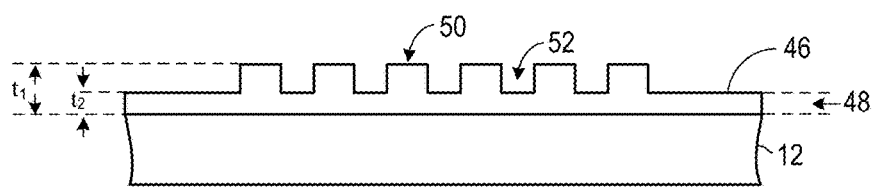
FIG. 2 illustrates a simplified view of the substrate illustrated in FIG. 1, having a solidified patterned layer formed thereon.

Referring to FIGS. 1 and 2, nanoimprint lithography system 10 may further comprise energy source 38 that directs energy 40 along path 42. Imprint head 30 and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head 30, fluid dispense system 32, source 38, and/or camera 58 and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness t2.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Substrate 12 and patterned layer 46 are then subjected to additional processes, such as etching processes, to transfer a relief image into substrate 12 that corresponds to the pattern of patterned layer 46. Substrate 12, thus patterned, can then be further subjected to known steps and processes for device fabrication, including, for example, oxidation, film formation, deposition, doping, planarization, etching, resist removal, dicing, bonding, and packaging, and the like. Similarly, substrates patterned by other methods or techniques, such as optical lithography, photolithography, extreme ultraviolet lithography and electron beam lithography, etc. can likewise be similarly processed to yield functional devices.

Currently, many advanced semiconductor devices can require the patterning of both isolated and dense features having feature dimensions of less than 100 nm. As used herein, the term "feature dimension" or "feature size" refers to the narrowest lateral dimension of a patterned feature, e.g., the feature width where the patterned feature has a length greater than its width. For example, a line feature that is 50 nm wide and 5 microns long is considered to have a feature dimension or a feature size of 50 nm. The thickness (i.e., height) of the patterned feature is dictated by the amount of underlying material, film or substrate that is desired to be removed, i.e., the desired etch depth to be achieved, and by the selectivity of the etch resistance of the resist relative to the underlying material, film or substrate. In previous generations of lithographic techniques, when feature dimensions were greater than 100 nm, it was possible to create features, such as dense line patterns, with aspect ratios as large as or greater than 5:1 (aspect ratios being defined as the ratio of the feature height to the feature width). As an example, a 500 nm line might have a thickness (i.e., height) of 2.5 microns, corresponding to an aspect ratio of 5:1, which was sufficient for etching the patterns into underlying materials such as silicon dioxide, silicon nitride, silicon oxynitride, polysilicon, metals, such as tantalum, tungsten, chromium and aluminum, and metal silicides.

In photolithography applications, the maximum thickness of the imaged photoresist is typically dictated by two equations. The first describes the forces imparted to the resist during development. That is, after exposure, resists are then placed in developer solutions which selectively remove resist material where the light has impinged on the resist surface (for the case of a positive acting resist) or which selectively leave resist material where the light has impinged on the resist surface (for the case of a negative acting resist). Such developing step is then followed by a water rinse, and then a final drying step. However, the removal of water during the drying step imparts a capillary stress, a, between adjacent resist features, and is described by the first equation (Equation 1):

$$\sigma = 6\gamma \cos\theta \left[\frac{H}{W}\right]^2 \left[\frac{1}{S_1}\right] \qquad 1$$

where γ is surface tension, θ is the tangential angle of the water at the top of the resist feature, H/W is the aspect ratio (height to width), and $S_1$ is the space between resist patterns. As it can be seen in Equation 1, the smaller feature size, W, the higher the capillary stress the resist patterns experience.

Whether a feature remains upright or whether the stress imparted to the feature causes a permanent bending, typically referred to as feature collapse, depends upon the mechanical stiffness of the resist material. In addition to feature collapse caused by capillary stress during the drying stage, other processes, such as wet cleans can likewise create forces causing features to bend, touch and collapse. The removal of vapors on adjacent features has a similar effect. In the case of nanoimprint lithography, feature collapse can also occur because of lateral forces encountered during the separation of the template and wafer after curing the resist. The deflection of a feature can be described by the second equation (Equation 2):

$$\delta = \frac{3}{2}\left(\frac{F}{E}\right)\left(\frac{H}{w_l}\right)^3 \qquad 2$$

where δ is the amount of lateral movement of the feature, F is the imparted force (e.g., capillary stress, σ, or other force), E is Young's Modulus, H is the height of the feature and $w_l$ is the width of the feature. As can be seen in this equation, both the aspect ratio, $H/w_l$, and the mechanical stiffness (Young's Modulus) of the resist film, E, play an important role in feature collapse. Thus for any given aspect ratio, the amount of feature bending is inversely proportional to the mechanical stiffness of the material.

Figure 3:
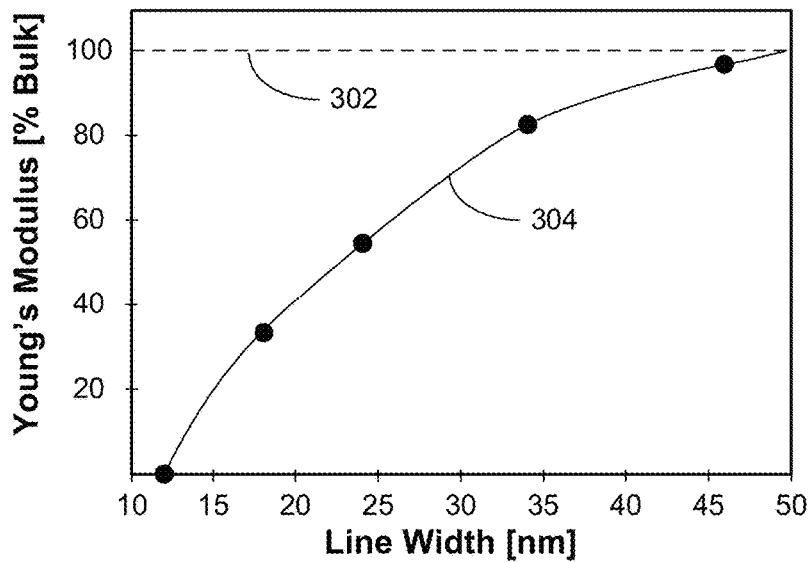
FIG. 3 illustrates a simplified plot of the mechanical stiffness (Young's modulus) of sub-100 nm features of a patterned layer similar to that of FIG. 2.

However, as feature sizes shrink to dimensions less than 100 nm, aspect ratios on the order of 5:1 or greater can no longer be sustained. This is because the mechanical properties of the resist material begin to deviate from its bulk properties at such smaller dimensions. As an example, FIG. 3 plots the predicted Young's Modulus of a thin film formed of a polystyrene having line features with widths less than 50 nm. As shown, the actual Young's Modulus (plot line 304) of the features deviates from the bulk value Young's Modulus (plot line 302) as the line width falls below 50 nm, such that the actual Young's Modulus of the features falls to about 60% of the bulk value Young's Modulus at 30 nm and less than 40% of the bulk value at 20 nm. As a result, for resist features less than 50 nm, a more reasonable working expectation is an aspect ratio of 2.5:1 or less regardless of the lithographic method used. And as line size drops below 25 nm, aspect ratios of even 2.5:1 can become challenging.

Figure 4:
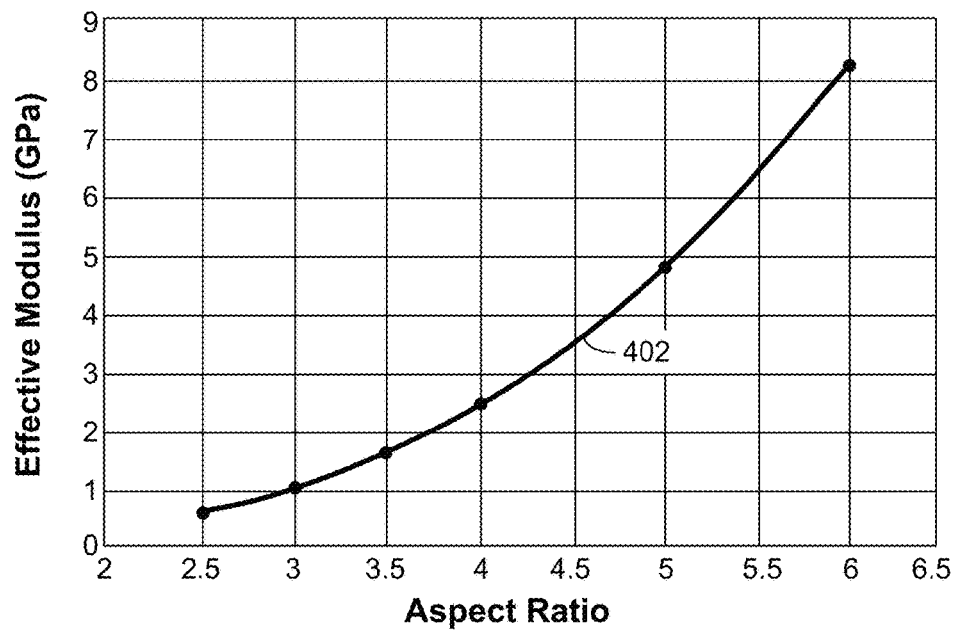
FIG. 4 illustrates a simplified plot of the mechanical stiffness (Young's Modulus) required to support a sub-100 nm feature as a function of feature aspect ratio.

A guideline for the necessary material stiffness required for such small feature sizes (i.e., less than 50 nm) can be extrapolated from line plots such as depicted in FIG. 3 and Equation 2. Considering a case where the bulk Young's Modulus of a material is on the order of 1 GPa but drops to about 60% of the bulk value at 30 nm feature size, thereby creating an actual or Effective Young's Modulus for such feature of about 0.60 GPa. The term "Effective Young's Modulus" or "$E_{eff}$" as used herein means the Young's Modulus value taking into account the width of the feature at feature sizes less than 50 nm such that it is some lesser percentage of the bulk value Young's Modulus for the material used to form such feature. By then applying Equation 2, which describes that the imparted deflection of any feature is proportional to the third power of the aspect ratio of the feature and inversely proportional to Young's Modulus, a plot can be derived that describes the necessary effective Effective Young's Modulus for the given desired aspect ratio. An example of such a plot is depicted in FIG. 4. Here, plot 402 shows the behavior of the Effective Young's Modulus as a function of aspect ratio. At an aspect ratio of 2.5:1, 30 nm features can be supported by an Effective Young's Modulus of ~0.60 GPa. If, however, an aspect ratio of 3.5:1 is desired, the Effective Young's Modulus needs to increase to ~1.65 GPa. Similarly, if an aspect ratio of 5:1 is desired, the Effective Young's Modulus would need to be increased to just under 5:1. The actual Effective Young's Modulus may change of course depending on the actual material and the size of the feature. In any case, however, the deflection of a feature will always be proportional to the third power of the aspect ratio of the feature and inversely proportional to the Effective Young's Modulus.

As aspect ratios decrease to 2.5:1 or less, however, it becomes very difficult, if not impossible, to use a patterned resist layer itself to successfully pattern the underlying material. Thus more complex structures that can stand up to the dry etch plasma-based processes used to etch the underlying material or substrate are typically used. Such structures or "stacks" are typically composed of two or more materials, and are sometimes referred to as "multilayer stacks." For example, a multilayer stack can consist of a patterned resist layer, a hardmask layer, such as spin-on glass (SOG), beneath the patterned resist layer, and an underlying film, such as e.g. a carbon layer such as spin on carbon (SOC) layer or other carbon-based comparable material, applied to a substrate. In addition to carbon-based materials, the underlying film, may contain silicon or other inorganic elements that provide good etch resistance. Alternatively, the underlying film can be entirely inorganic, as long as the hardmask layer applied over the underlying film is appropriately selected so as to provide good etch selectivity between the hard mask and underlying film. As an example, the underlying film might be silicon dioxide and the hardmask could be chromium. Such underlying films, including carbon-based films, can be spun-on or applied using vacuum-based methods, including sputter deposition and chemical vapor deposition and electron beam evaporation. In the case of SOC, the SOC layer typically contains a high weight percent of carbon, making it both etch resistant and mechanically stiff. For other organic-based carbon materials, such as e.g. a novolac resist, thermally sensitive cross-linking components can be added that increase densification, etch resistance and stiffness through a bake process prior to applying the hardmask layer. Both etch resistance and stiffness of the carbon layer are important since the pattern features transferred into the carbon layer will be used for subsequent pattern transfer into the substrate.

Such multilayer stack solutions work reasonably well enough except for situations where the surface on which the multilayer stack is deposited is not planar. Indeed, no surface is perfectly planar, and it is well known that spin on films, such as SOC, do not perfectly planarize the underlying topography of the substrate nor are vacuum based application methods successful for planarization. There are two non-planar situations of particular note. The first is the case where "short wavelength" planar excursions occur on the surface (i.e., excursions occurring over a scale of nanometers or microns cause a small planar perturbation on such a short scale). For imprint lithography applications, this will result in small changes in the residual layer thickness, which in turn creates a critical dimension (CD) uniformity error after pattern transfer. For all types of optical lithography, scanners cannot correct for height variations over such a short scale, and the resulting deviation in planarity impacts the depth of focus budget for a scanner or stepper and thereby likewise introduces similar CD errors during resist imaging.

Figure 5A:
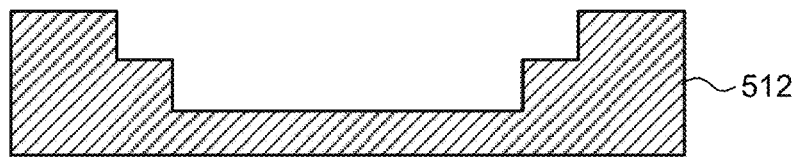
FIGS. 5A-5H illustrate simplified views of a pattern transfer sequence into a multilayer resist stack and then into a substrate.

A second more difficult issue occurs when topography variations are present over 10's of microns, or even millimeters, of the substrate. An example of this type of topography is shown in FIG. 5A. FIG. 5A shows substrate 512 having a large area (over either several microns or several millimeters) where the topography is either raised or lowered. Such topography variations can range anywhere from a few nanometers to many tens or even hundreds of nanometers. Topographies on the order of hundreds of nanometers create severe imaging problems. Typically a chemical mechanical polishing (CMP) step is applied in order to reduce such topography variations. Even with a CMP step, however, the final topography may still have variations in the 10's of nanometers. In the case of optical lithography, a scanner can compensate for some of this topography variation across larger areas. However at transition areas, depth of focus issues become severe and imaging is severely impacted. As a result, device manufacturers may be forced to do two separate exposures with two different masks in order to create the correct pattern for the level of interest, adding significant cost to the device fabrication process. In the case of nanoimprint lithography, such a topography issue can likewise have severe consequences. That is, large excursions in planarity can cause residual layer thickness variations which impact critical dimension (CD) uniformity, as previously described. More fundamental problems can also be observed, such as slower resist filling (which impacts tool throughput and therefore cost of ownership) and in some cases non-fill defects which can impact the functionality of the device being made.

Figure 5B:
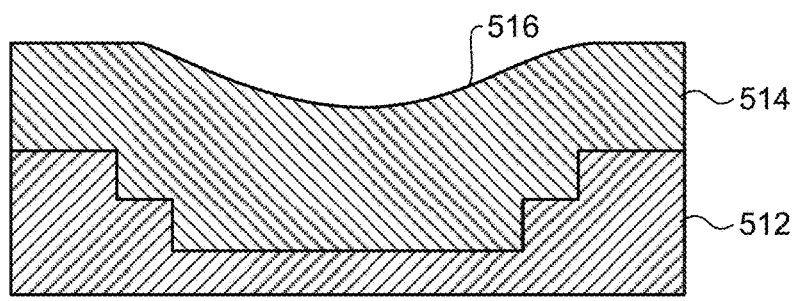
Figure 5C:
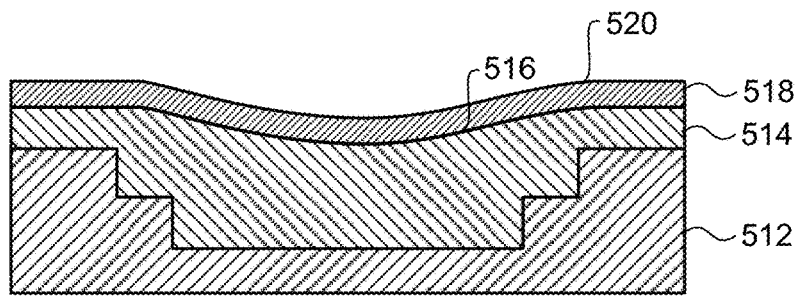
Figure 5D:
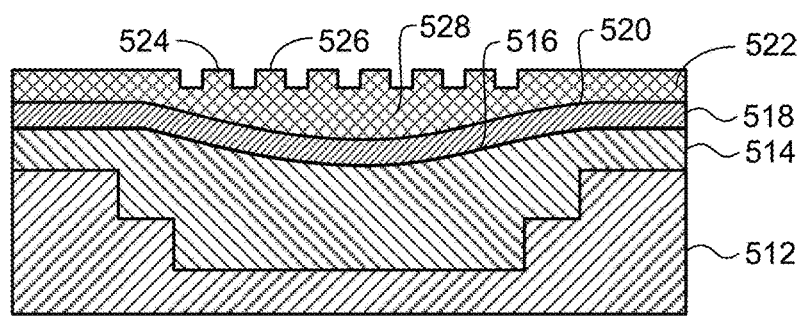
Figure 5E:
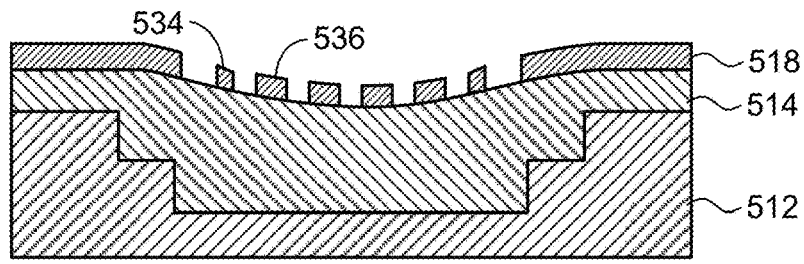
Figure 5F:
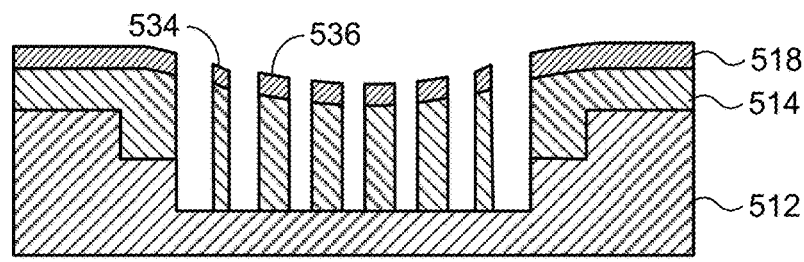
Figure 5G:
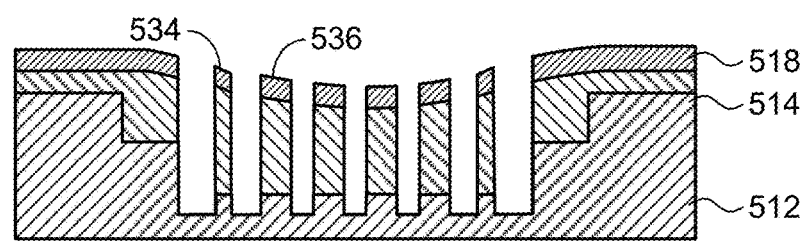
Figure 5H:

A pattern transfer scheme over such topography with the consequential deleterious impact of critical dimension variability in the transferred features is illustrated in FIGS. 5A-5H. Referring to FIG. 5A, substrate 512 has an associated topography extending over a large area (e.g. several microns or more). In FIG. 5B, SOC layer 514 has been deposited onto substrate 512 with surface 516 taking on a topography associated with the underlying topography of substrate 512. That is, the topography of surface 516 of SOC layer 514 corresponds to the underlying topography of substrate 512. Although planarity variations of SOC layer 514 are not as pronounced as those of the underlying substrate 512, they nevertheless continue to present a surface having planarity variations. In FIG. 5C, hardmask layer 518 has been deposited over SOC layer 514. Notably, hardmask layer 518 has a surface 520 that conforms to the topography of SOC layer 514, such that hardmask layer 518 presents surface 520 having the same planarity variations as surface 516 of SOC layer 514. In FIG. 5D, patterned layer 522 having uniform features 524 and 526 has been applied over hardmask layer 518 by nanoimprint processes. Because of the topography variations of hardmask layer 518, patterned layer 522 has a non-uniform residual layer 528. FIG. 5E depicts the resultant pattern transfer of patterned layer 522 into hardmask layer 518 to form features 534 and 536 in hardmask layer 518. Because of the residual layer non-uniformity, the critical dimension (CD) of the smallest patterned transferred features 534 and 536 (also referred to as the "critical features"), are no longer uniform, since the etch time to clear away the residual layer 525 varies as a function of the varying thickness of residual layer 528. The non-uniformity of features 534 and 536 is thus carried over, as the pattern transfer continues into the SOC layer 514, as shown in FIG. 5F. Finally, the underlying substrate 512 is etched and remaining SOC and resist material removed (FIGS. 5G-5H), with the resulting final substrate features 544 and 546 having a non-uniformity commensurate with the non-uniformity introduced during the etching of residual layer 522. As previously described, such critical dimension non-uniformity is not limited to nanoimprint lithography. Variations in topography also affects the depth of focus budget in optical and extreme ultraviolet (EUV) lithography, likewise resulting in critical feature non-uniformity introduced during the exposure process.

The present invention by contrast provides for a solution that: (1) creates a planar surface so that the patterned features can be easily defined without creating non-uniformity errors in the critical features, or other defect issues, or necessitating the use of multiple lithography steps to form all of the patterned features, and (2) results in a structure that, after the transfer etch, still has good etch resistance and is mechanically stable so that high aspect ratio features (features with aspect ratios 2.5:1 or more) do not bend, wiggle or collapse under standard processing conditions. As further detailed herein, this is accomplished by: (1) first applying a carbon film layer, such as e.g. a SOC layer, onto a substrate containing topographical variations, (2) applying a thin organic planarizing film on top of the carbon layer, (3)

applying a hardmask layer on top of the carbon layer, (4) forming a patterned layer over the hardmask layer, for example, by imprint or optical lithography processes, with steps (1)-(4) thereby forming a multilayer stack of carbon film, planarizing film, hard mask and patterned layer, and (5) transferring the pattern of the patterned layer into the multilayer stack and then into the underlying substrate. In certain examples, the multi-layer stack has a composite effective mechanical stiffness ($E_{eff}$) that is capable of sustaining 50 nm or smaller features at aspect ratios of 2.5:1 or more under typical processing conditions. An embodiment of such a process is detailed in FIGS. 6A-6I as follows.

Figure 6A:
FIGS. 6A-6I illustrate simplified views of a pattern transfer sequence into a multilayer resist stack and then into the substrate according to an embodiment of the invention.
Figure 6B:
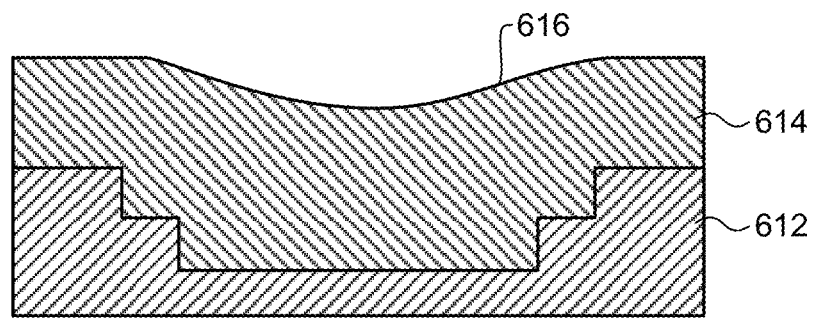
Figure 6C:
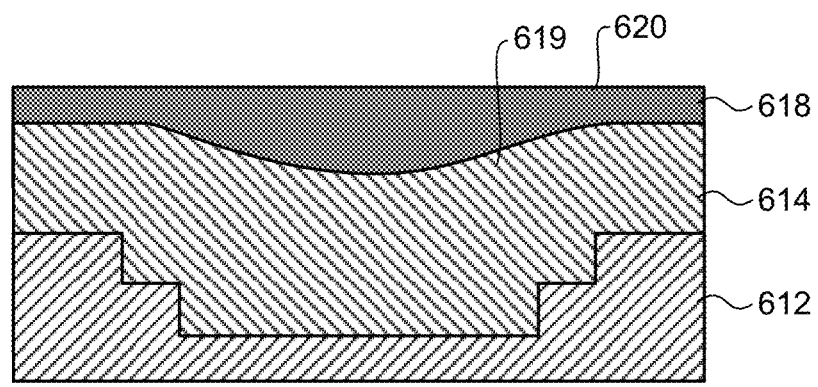
Figure 6D:
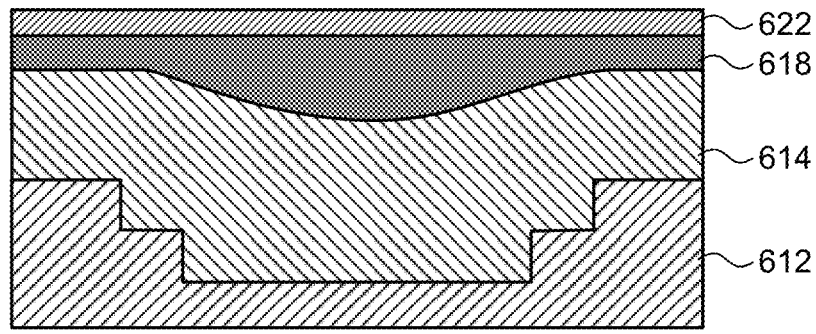
Figure 6E:
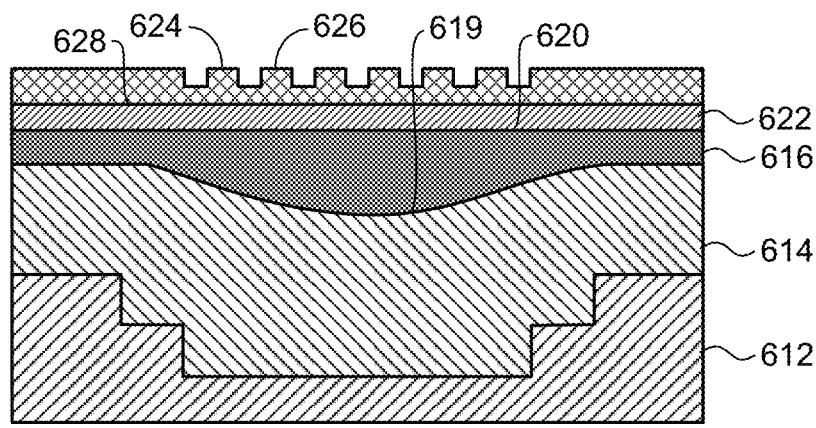
Figure 6F:
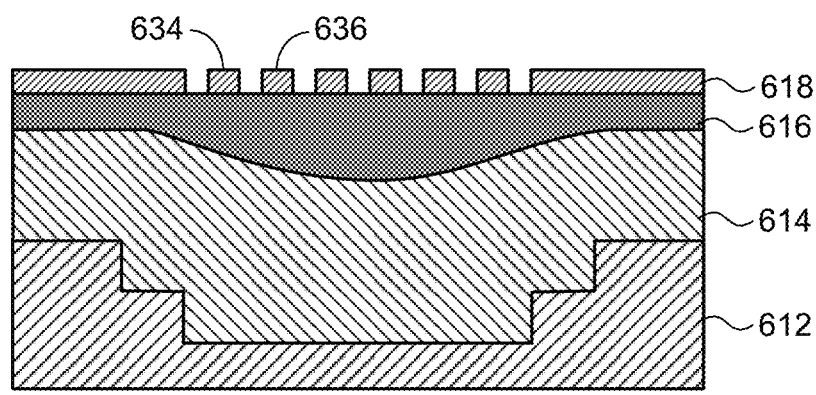

Referring to FIG. 6A, substrate 612 has the same non-planar topography as substrate 512 in FIG. 5A. In FIG. 6B, SOC layer 614 is deposited onto substrate 612 such that surface 616 of SOC layer 614 takes on a topography that is associated with the underlying topography of substrate 612, similar to FIG. 5B. In FIG. 6C, planarization material is then applied over the SOC layer 614 to form planarizing layer 618. Notably, top surface 620 of planarizing layer 618 is indeed flat, that is, it does not take on any topography that is associated with the underlying topography of surface 616 of SOC layer 614. Thus features that are patterned over SOC layer 614, using e.g. optical or imprint lithography, can be transferred without the critical dimension variation or other disadvantages resulting from surface topography variations as previously described. FIGS. 6D-6I depict further process steps. In FIG. 6D, hardmask layer 622 has been deposited over planarizing layer 616, and in FIG. 6E patterned layer 620 with features 624 and 626 and having residual layer 628 is formed over hardmask layer 618. FIG. 6F illustrates the result of a uniform etch of residual layer 622 followed by a transfer etch of the pattern into hardmask layer 618 to form features 634 and 636. Then in FIG. 6G, the pattern is etched into both planarizing layer 616 and SOC layer 614. As planarizing layer 616 and SOC layer 614 are typically both organic, the etch chemistry used to etch the two materials can be the same and typically consists of a main etchant gas such as oxygen, carbon monoxide, carbon dioxide, in combination with additional gases such as helium, or argon. Finally, as shown in FIGS. 6H-6I, the pattern is transferred into substrate 612 to form final features 644 and 646 with the remaining layers removed either by plasma etch or wet etch.

Figure 6G:
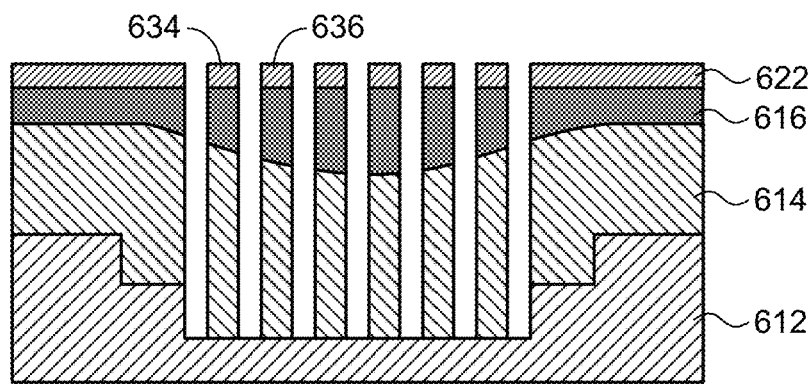
Figure 6H:
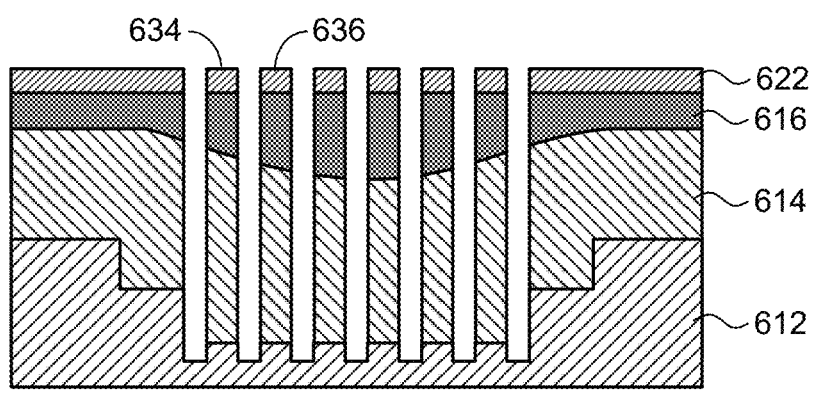
Figure 6I:

Of importance to the above described process is that after the pattern transfer step depicted in FIG. 6G, there remains a relatively thick layer of SOC (SOC layer 614) adhered to substrate 612. As further described herein, this SOC layer 614, which is adjacent to substrate 612, provides mechanical stiffness to the etched features 634 or 636, such that bending of the etched feature is minimized, as opposed to having the planarizing layer, which has much less mechanical stiffness, being positioned adjacent the substrate. Additionally, SOC layer 614 provides good etch protection for the subsequent etch into substrate. This can also be important, since planarizing layer 616 may not have equivalent etch resistance to SOC layer 614. In certain cases, planarizing layer 616 can have a drop-off in etch resistance of 0%-30% relative to SOC layer 614. Thus, in certain aspects, what is advantageous is the order of deposition of SOC and planarizing materials in providing the high aspect ratio structure, i.e., applying the SOC layer applied first, followed by the planarizing layer. By adopting this approach (1) the surface topography is planarized prior to applying the hardmask layer and subsequent patterning layer, thereby assuring minimal variations in critical dimension during the transfer etch, and (2) the deposition of the SOC layer prior to applying the planarizing layer assures good mechanical stiffness of the feature after the etch of the entire multilayer stack, thus avoiding feature collapse. These advantages are further illustrated with reference to FIGS. 7-8.

Figure 7:
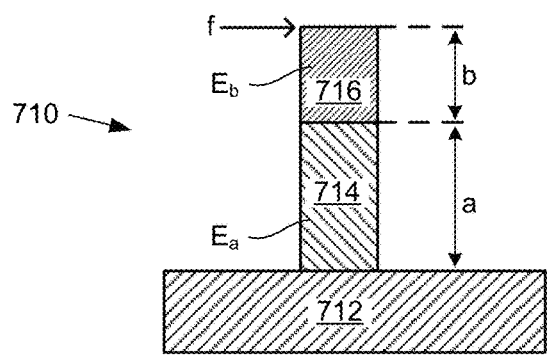
FIG. 7 illustrates a simplified view of a feature formed in a multilayer resist stack similar to that depicted in FIG. 6G.

FIG. 7 shows the simplified case of a single transfer etch feature 710, in which SOC layer 714 is applied on substrate 712 and beneath planarizing layer 716. Note that for purposes of illustration, a hardmask layer is not shown as its thickness is negligible relative to thicknesses of planarizing layer 716 and SOC layer 714. In this case, the deflection of feature 710 caused by application of lateral force, f, applied at the top of feature 710 is no longer simply inversely proportional to Young's modulus. Instead, it contains higher order correction terms and takes the form of the following equation (Equation 3):

$$\delta = f/I(a^3/3E_a + b^3/3E_b + ab(a+b)/E_a) \qquad 3$$

where $\delta$ is the amount of lateral deflection (or movement) of the feature, f is the imparted force, I is moment of inertia, a is the thickness (or height) of SOC layer 714, $E_a$ is the Young's modulus of SOC layer 714, b is the thickness (or height) of planarizing layer 716, and $E_b$ is the Young's modulus of planarizing layer 716. For purposes of illustration, assume $E_a$ is set to 5 GPa and $E_b$ is set to 1 GPa, so that the ratio between $E_a$ and $E_b$ is 5 (i.e., $E_a/E_b=5$). If the total feature thickness (or height) is normalized such that a+b=1, then the deflection $\delta$ takes on the form of the following equation (Equation 4):

$$\delta = F/I(b^3/3E_b + (1-b)^3/3E_a + b(1-b)/E_b). \qquad 4$$

Figure 8:
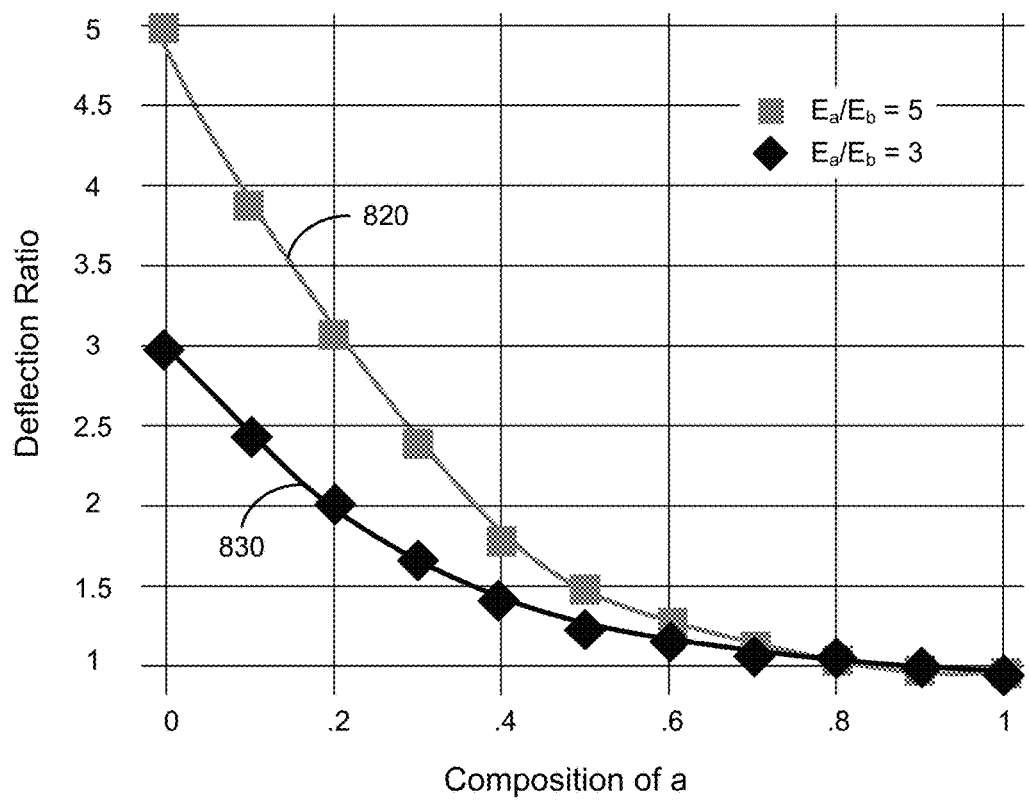
FIG. 8 illustrates simplified plots of the deflection ratios of features similar to the feature of FIG. 7 as a function of its material composition.

Using Equation 4, the amount of relative lateral deflection of the feature (or the "Deflection Ratio") can be plotted as a function of the height, a, of the SOC layer as a proportion of the total height (a+b) of the composite feature. Referring to FIG. 8, plot 820 shows the Deflection Ratio for the situation where $E_a/E_b$ is equal to 5. In this situation, where the feature is entirely composed of SOC layer 714 such that the proportion of a is equal to 1.0 then the relative deflection is at a minimum value of 1.0, and where the feature is entirely composed of material planarizing layer 716 (i.e., material b) such that the proportion of a is 0, then the relative deflection is 5× greater, or 5.0. Similarly plot 830 shows the Deflection Ratio for the situation where $E_a/E_b$ is equal to 3. Here, when the feature is entirely composed of SOC layer 714 such that the proportion of a is equal to 1.0 then the relative deflection is at a minimum value of 1.0, and where the feature is entirely composed of material b such that the proportion of a is 0 then the relative deflection is 3× greater, or 3.0.

As an example of how this Deflection Ratio impacts the material composition of such a multilayer stack, assume the situation of plot 820 where the SOC layer has an Young's modulus of 5, the planarizing layer has a Young's modulus of 1, such that $E_a/E_b$ is equal to 5 and further where an aspect ratio of 5:1 is required for the subsequent etch step. Referring to FIG. 5, an Effective Modulus close to 5 is required to support a small feature (e.g. less than 50 nm) at such a 5:1 aspect ratio. Referring back to plot 820 of FIG. 8, it can be seen that by substituting a 100% SOC layer with a composite stack made of 80% SOC and 20% planarizing material, the change in the Deflection Ratio shifts by only 3% relative to a feature made entirely of 100% SOC material. As the SOC material in this example has a Young's Modulus of 5, then such a 3% shift in relative Deflection Ratio lowers the Effective Modulus of the composite material by the same 3%, resulting in an Effective Modulus of 4.85 GPa for the composite material, which is entirely sufficient to support the desired 5:1 aspect ratio feature.

Now for the same situation, consider further addressing the additional issue of topography variation in addition to feature aspect ratio. If for example, the critical feature is 30 nm wide, then a 5:1 aspect ratio would dictate that the total composite stack must be 150 nm. If 20% of the stack is derived from the planarizing layer, the planarization layer thickness would be 30 nm. If the underlying topography variation of the substrate is less than 30 nm, then a 20% planarizing layer (30 nm) would be sufficient to planarize such topography. In practice, however, the planarization situation is improved as the SOC film itself is applied by being spun down upon the substrate first and in the course of doing so already reduces a portion of the topography variation. That is, spin on films can typically reduce the amount of planarization required by about half (depending on feature spacing, i.e., small feature spacing (less than ~1 micron) is planarized much more efficiently than larger feature spacing) of the underlying topography variation. As a result, a starting topography variation of 30 nm would be readily planarized by the above approach, and even starting topography variations of up to about 60 nm can be addressed by first applying the 80% spin-on SOC layer and then applying the 20% planarizing film.

As a second example, if for the same material conditions (i.e., SOC material with Young's Modulus of 5 and planarizing material with Young's Modulus of 1) a small feature aspect ratio of only 4:1 is required, then according to FIG. 5, the Effective Young's Modulus can be as low as 2.46 GPa. By operation of Equation 2, by reducing the Young's Modulus by a factor of 2 (i.e., from 5 GPa down to 2.46 GPa), the amount of acceptable deflection d is increased by a factor of 2. In this case, then, with reference to plot 820 of FIG. 8, a Deflection Ratio of 2 can be accommodated. As a result, a 4:1 aspect ratio can be supported by as little as 30% SOC with as much as 70% of the composite thickness of the feature coming from the lower modulus planarization film.

In a third example, assume a Young's modulus of 6 GPa for SOC layer 714 and a Young's Modulus of 2 GPa for the subsequently deposited planarizing film 716. In this case the Young's modulus ratio between the two films is 3 ($E_a/E_b=3$). The Deflection Ratio for this example (FIG. 8, plot 830) for this situation varies from 1.0-3.0. As in the first example, we can again target a feature aspect ratio of 5:1 which again corresponds to the case where the Effective Young's modulus must be at least just under 5. According to plot 830, up to 30% of the composite stack can now be comprised of planarizing film 716 while only increasing the Deflection Ratio up to about 10%. As the SOC material in this example has a Young's Modulus of 6, such a 10% shift in relative Deflection Ratio corresponds to a lowering of the Effective Modulus by a similar amount, resulting in an effective Young's modulus of that is still well above 5 and which, as previously noted, is fully able to support a 5:1 aspect ratio.

As a fourth example, if the same material composition as in example 3 is used but if an aspect ratio of only 4:1 is required instead, then according to the plot of FIG. 5, the Effective Young's modulus can be as low as 2.46 GPa. By reducing the Young's Modulus by more than a factor of 2 (i.e., from 6 GPa down to 2.46 GPa), the amount of acceptable deflection d is increased by a factor of greater 2. In this case, according to plot 830, a Deflection Ratio greater than 2 can be accommodated, and as a result, as much as about 80% of the composite thickness can come from the lower modulus planarization film, with as little as 20% of the composite thickness coming from the SOC film. Note here that because a significant amount of planarizing film can be incorporated into the composite stack, both the problems of achieving a high aspect ratio feature structure and providing a composite stack that can fully planarize an underlying topography on the order of 10's of nanometers are satisfactorily addressed.

One of skill in the art will appreciate that many other combinations of composite thicknesses and Effective Young's Modulus are possible. The key criteria is to maintain enough effective mechanical stiffness in the composite feature to avoid line or feature collapse. Assuming a modest Young's Modulus of 1 GPa for the planarizing layer, and a Young's Modulus of 5 GPa for the SOC, as previously described, a 5:1 aspect ratio requires an effective Young's Modulus of just under 5. As aspect ratio decreases, a lower effective Young's modulus is satisfactory and the effective mechanical stiffness of the composite structure can be relaxed accordingly. However, if feature size decreases, and thus the value of the effective Young's Modulus for either material component decreases, as illustrated in FIG. 3, then the Effective Young's modulus of the multilayer stack would need to increase accordingly.

Of course, the values for Young's Modulus will vary depending on the actual materials chosen to build the composite stack. Young's modulus for the SOC film can vary anywhere between about 2 and 10 GPa. The range for the planarizing material, when deposited using spin-on techniques, is approximately 1-2 GPa. Therefore, the final effective mechanical stiffness of the composite feature will vary according to the aspect ratio required and the actual effective Young's modulus of the planarizing layer and SOC layer composite. The effective Young's modulus can be enhanced by using planarization films that are not spin coated and are instead deposited using vacuum techniques such as sputtering, chemical vapor deposition or electron beam deposition.

Figure 9:
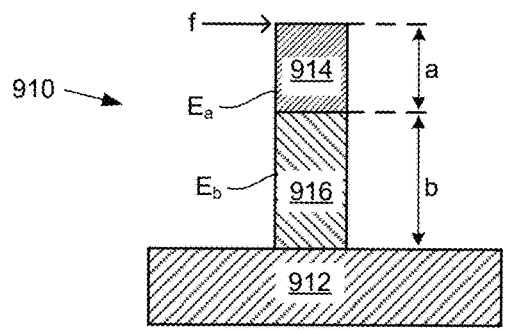
FIG. 9 illustrates a simplified view of a feature formed in a different multilayer resist stack.

FIG. 9 depicts a counter example showing the importance of deposition order. In this example, feature 910 is formed in the reverse, that is, by first depositing planarizing layer 916 on substrate 912, followed by the SOC material deposition to form SOC layer 914. The thickness of planarizing layer 916 and its Young's modulus are designated by b and $E_b$, respectively. The thickness of the SOC layer 914 and its Young's modulus are designated by a and $E_a$, respectively. The force imparted on the composite feature 910 is designated by f. (Again, a hardmask layer is not shown, as its thickness is so thin relative to the planarizing and SOC layers as to be negligible.) For this case, the deflection δ of composite feature 910 caused by the application of a lateral force f is likewise no longer simply inversely proportional to Young's modulus. Instead, it also contains higher order correction terms and takes the form of the following equation (Equation 5):

$$\delta = f/I(b^3/3E_b + a^3/3E_a + ab(a+b)/E_b), \quad 5$$

where f is the imparted force on the feature, and I is the moment of inertia. For purposes of illustration, assume $E_a$ is 5 GPa and $E_b$ is 1 GPa such that the ratio between $E_a$ and $E_b$ is 5 (i.e., $E_a/E_b=5$). If the composite thickness is normalized such that a+b=1, then the deflection takes on the form of the following equation (Equation 6):

$$\delta = f/I(b^3/3E_b + (1-b)^3/3E_a + b(1-b)/E_b). \quad 6$$

Figure 10:
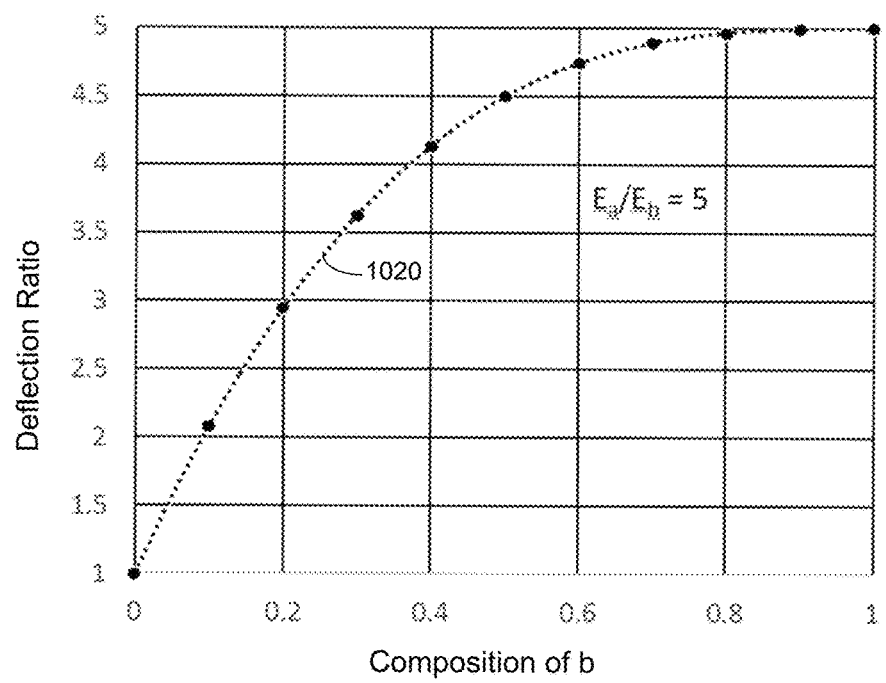
FIG. 10 illustrates a simplified plot of the deflection of the feature of FIG. 9 as a function of its material composition.

Using Equation 6, the "Deflection Ratio," or amount of relative deflection, is plotted in FIG. 10 (plot 1020) as a function of the height of the planarizing material, b, (i.e., the "Composition of b" in FIG. 10). From this plot it can be seen that when planarizing material is not incorporated into the feature, i.e., the feature is entirely composed of SOC material, the relative deflection is at its minimum of 1. For the case where there is no SOC material is applied, i.e. the feature is entirely composed of planarizing material, then the deflection jumps by a factor of 5, and as described earlier, due to the low mechanical stiffness of the planarizing material when used by itself, it cannot support an aspect ratio of better than 2.5:1.

What is important to note here, however, is that incorporating even a small amount of planarizing material as the bottom layer of a multilayer stack creates a situation in which feature collapse occurs. As an example, and referring again to FIG. 10, if only 10% of the total thickness of the feature is planarizing material, the deflection ratio doubles (2×) as compared to using SOC entirely. Such an increase in deflection ratio means the Effective Modulus is cut by a factor of 2. So if the SOC Young's Modulus was originally 5 GPa and the planarizing film has a modulus of 1, then by adding only 10% of planarizing film as the bottom layer, the effective Young's modulus drops to only 2.5, which, according to plot 402 in FIG. 4, is insufficient to sustain an aspect ratio of greater than 4:1.

As a second example, if the targeted aspect ratio is relaxed to just under 4:1, then a composite stack with 10% planarizing film as the bottom layer can operate to satisfy the mechanical stiffness requirement to support the <4:1 aspect ratio. However, if there is existing topography of just 15 nm for example, and a 30 nm critical feature size is required, then the height of the composite film would 120 nm. As such, a 10% planarizing film would have a thickness of only 12 nm, meaning that not enough planarizing film would be deposited to planarize the existing 15 nm of topography variation. As a result, even for this relaxed case with lower aspect ratio, a composite film stack cannot be provided that addresses both the aspect ratio needed for the subsequent etch and also a planarizing film thick enough to address the underlying topography issues. As an extension of such a case where the planarizing layer is deposited first, as increased topography variations are introduced, thereby creating a need for even thicker planarizing films, many aspect ratios even lower than 4:1 cannot be supported.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
   providing a substrate having a surface having non-planar surface variations;
   forming a multilayer stack over the substrate, by:
      forming a composite layer over the substrate, by;
         applying a first underlying layer over the substrate, with the resultant first underlying layer having non-planar surface variations corresponding to the non-planar surface variations of the underlying substrate, and
         applying a second planarizing layer over the first underlying layer; depositing a hard mask on the composite layer; and forming a patterned layer on the hard mask, the formed patterned layer having features,
   performing one or more etch steps to etch the features of the patterned layer into the multilayer stack to produce one or more etched features in the multilayer stack;
   wherein the composite layer has a composite effective mechanical stiffness ($E_{eff}$) sufficient to maintain the one or more etched features having a feature dimension of 50 nm or less and an aspect ratio of 2.5:1 or more with minimal feature collapse; and
   wherein the one or more etch steps transfer the one or more etched features in the multilayer stack into the substrate.

2. The method of claim 1 wherein the first underlying layer comprises a carbon layer.

3. The method of claim 1 wherein the first underlying layer comprises a spin-on carbon (SOC) layer.

4. The method of claim 1 wherein the second planarizing layer comprises an organic material.

5. The method of claim 1 wherein the second planarizing layer has a Young's modulus less than a Young's modulus of the first underlying layer.

6. The method of claim 1 wherein the one or more etched features have aspect ratios of 5:1 or more.

7. The method of claim 1 wherein feature collapse of the one or more etched features in the multilayer stack is reduced as compared to comparable features etched under comparable etch conditions;
   wherein the comparable features are etched into a comparable stack comprising:
      a comparable planarizing layer having the same material properties as the second planarizing layer over a comparable surface of a comparable substrate;
      a comparable hard mask on top of the comparable planarizing material;
      a comparable patterned layer on the comparable hard mask having the comparable features;
   wherein the comparable surface has comparable non-planar surface variations that are of the same magnitude as the non-planar surface variations;
   wherein the comparable substrate has the same material properties as the substrate;
   wherein the comparable hard mask has the same material properties as the hard mask;
   wherein the comparable features have the same dimensions as the features of the formed patterned layer;
   wherein the comparable patterned layer has the same material properties as the patterned layer; and
   wherein the comparable etch conditions are the same etch conditions used to form the one or more etched features.

8. The method of claim 1 wherein etch resistance of the second planarizing layer is within 30% of etch resistance of the first underlying layer.

9. The method of claim 1 wherein the patterned features have specified critical dimensions (CDs) and wherein the etched features in the multilayer stack maintain higher critical dimension (CD) uniformity as compared to comparable features etched into a comparable stack;
   wherein the comparable stack comprises:
      a comparable planarizing layer having the same material properties as the first planarizing layer over a comparable surface of a comparable substrate;
      a comparable hard mask on top of the comparable planarizing material;
      a comparable patterned layer on the comparable hard mask having the comparable features;

wherein the comparable surface has comparable non-planar surface variations that are of the same magnitude as the non-planar surface variations;

wherein the comparable substrate has the same material properties as the substrate;

wherein the comparable hard mask has the same material properties as the hard mask;

wherein the comparable features have the same dimensions as the features of the formed patterned layer; and wherein the comparable patterned layer has the same material properties as the patterned layer.

10. The method of claim 1 wherein the second planarizing layer is applied by an imprint lithography technique.

11. The method of claim 1 wherein the composite effective mechanical stiffness ($E_{eff}$) is sufficient to maintain the one or more etched features without feature collapse prior to the one or more features being transferred into the substrate.

12. A method of manufacturing a device comprising:
transferring features of a formed patterned layer into a substrate according to the method of claim 1; and
processing the substrate to manufacture the device.

13. A method according to claim 12 wherein the substrate further comprises a semiconductor wafer and wherein the manufactured device is a semiconductor device.

\* \* \* \* \*